(12) United States Patent
Patel et al.

(10) Patent No.: US 8,046,015 B2
(45) Date of Patent: Oct. 25, 2011

(54) ADAPTIVE TUNING TO IMPROVE DEMODULATOR PERFORMANCE

(75) Inventors: Dipak R. Patel, Hatboro, PA (US); Navaneetha Krishna Kankipati, Dublin, CA (US); Craig G. Martin, Chalfont, PA (US)

(73) Assignee: General Instrument Corporation, Horsham, PA (US)

( * ) Notice: Subject to any disclaimer, the term of this patent is extended or adjusted under 35 U.S.C. 154(b) by 833 days.

(21) Appl. No.: 11/836,942

(22) Filed: Aug. 10, 2007

(65) Prior Publication Data
US 2009/0023407 A1  Jan. 22, 2009

Related U.S. Application Data

(60) Provisional application No. 60/951,116, filed on Jul. 20, 2007.

(51) Int. Cl.
*H04B 7/00* (2006.01)
*H04B 1/16* (2006.01)

(52) U.S. Cl. ..................... 455/502; 455/182.1

(58) Field of Classification Search .............. 455/502, 455/208, 265, 182.1, 182.2, 180.3; 375/324, 375/327
See application file for complete search history.

(56) References Cited

U.S. PATENT DOCUMENTS

| | | | | |
|---|---|---|---|---|
| 5,170,497 A | * | 12/1992 | Uchikura | 455/183.2 |
| 5,280,640 A | * | 1/1994 | Bae | 455/182.3 |
| 5,305,464 A | * | 4/1994 | Frett | 725/15 |
| 5,731,741 A | | 3/1998 | Yamamoto et al. | |
| 5,828,710 A | * | 10/1998 | Beale | 375/344 |
| 6,173,164 B1 | | 1/2001 | Shah | |
| 7,123,650 B2 | * | 10/2006 | Asia et al. | 375/222 |
| 7,127,010 B1 | | 10/2006 | Parker | |

OTHER PUBLICATIONS

PCT Search Report & Written Opinion, RE: Application #PCT/US2008/070245; Oct. 1, 2008.

* cited by examiner

*Primary Examiner* — Sonny Trinh
(74) *Attorney, Agent, or Firm* — Brian G. Brannon

(57) ABSTRACT

A receiver is tuned to a transmission frequency of a data signal after the receiver has already locked onto a frequency carrying the data signal. A frequency offset between a locked frequency of a tuner on the receiver and the actual transmission frequency is determined by a comparator. If the frequency offset is greater than a threshold value, then the tuner is stepped to another frequency and the frequency offset is determined again. The direction of the tuning step can be determined by comparing multiple frequency offsets. An average value of multiple frequency offset measurements may also be used to determine if the tuner should retune to another frequency by comparison with the threshold value.

10 Claims, 3 Drawing Sheets

ADAPTIVE TUNING TO IMPROVE DEMODULATOR PERFORMANCE

This application claims priority to U.S. provisional application Ser. No. 60/951,116 entitled, "Adaptive Tuning To Improve Demodulator Performance", filed on Jul. 20, 2007, the content of which is incorporated herein by reference in its entirety.

FIELD OF THE INVENTION

The present invention relates to a method and apparatus for adaptive tuning. More particularly, the present invention relates to a method and apparatus for adaptive tuning to improve demodulator performance.

BACKGROUND OF THE INVENTION

A typical broadband communication system, such as a coaxial cable communication system (CATV), provides downstream data communications from a centralized node or headend to modems of many users. The downstream data communications are provided from the nodes or headends at specific frequencies. The communication system operators, e.g. multi-service operators (MSOs) may use several data communication frequencies and different frequencies are often used by different operators and different headends. The downstream data frequencies used are typically in a wide frequency spectrum which ranges range from 88 MHz to about 850 MHz.

When a modem is connected to the communications system, it typically scans the downstream frequency spectrum until a data signal is received. The modem typically locks onto the frequency at which the data signal is received. However, the data signal may be received at a frequency which is not the actual transmission frequency from the headend. For example, if an operator transmits a downstream data signal at 150.1 MHz, the modem may start to detect the data signal at 150 MHz and lock onto the 150 MHz frequency, i.e. 1 MHz away from the actual transmission frequency.

A modem maybe preprogrammed with a channel map which instructs the modem which frequencies to scan to detect a downstream signal rather than scanning the entire spectrum. However, an operator may use a transmission frequency which is not on the channel map. Moreover, the lock range, or channel pull up range, of a modem may encompass more than one channel on the channel map. As a result, even with a channel map, the modem may lock onto a frequency which is not the actual transmission frequency.

When a modem locks onto a frequency which is not the actual transmission frequency data will likely be received by the modem but the communications will not be optimal. In some instances, the error rates in the data received, e.g. the packet error rate and/or the bit error rate, may be sufficient to sustain the channel lock but may greatly reduce the communication speed and the quality of the data received. As a result, a user may not receive the data communications speeds from an operator at levels advertised by an operator. A user may also experience frequent loss of data packets which may impair communications with a network element, and may be particularly noticeable in voice communications, e.g. VoIP calls, video applications, and file downloads.

SUMMARY OF THE INVENTION

The present invention improves receiver performance by ensuring that the receiver receives communications on the transmitted frequency of a network operator.

A receiver in accordance with the present invention may comprise: a tuner configured to tune to communication channel frequencies as a locked frequency which provides a data signal; a controller configured to instruct the tuner to tune to specific communication channel frequencies; and a comparator configured to compare a locked frequency against a transmission frequency and to provide the result of the comparison to the controller as a frequency offset, wherein the controller instructs the tuner to tune another frequency when the frequency offset is greater than or equal to a predetermined threshold value. The receiver may further comprise a demodulator configured to receive the locked frequency and to demodulate the data signal contained in the locked frequency.

The controller may instruct the tuner to tune to frequencies in a direction based on a plurality of frequency offset measurements. The tuner may tune to another frequency which is a predetermined distance away from the locked frequency which may be determined by the controller based on the magnitude of the frequency offset. The tuner may use an average value of a plurality of frequency offsets which is greater than or equal to a predetermined threshold value to tune to another frequency.

A method of tuning a receiver to a transmission frequency may comprise the steps of: locking a tuner to a communication channel frequency which provides a data signal as a locked frequency; determining an amount of separation between the locked frequency and a transmission frequency to be received by the receiver as a frequency offset; determining if the frequency offset is greater than or equal to a threshold value; and tuning the tuner to another frequency if the frequency offset is greater than or equal to the threshold value.

A computer readable medium may carry instructions for a computer to perform a method of tuning a receiver to a transmission frequency comprising the steps of: locking a tuner to a communication channel frequency which provides a data signal as a locked frequency; determining an amount of separation between the locked frequency and a transmission frequency to be received by the receiver as a frequency offset; determining if the frequency offset is greater than or equal to a threshold value; and tuning the tuner to another frequency if the frequency offset is greater than or equal to the threshold value.

The present invention enables more accurate tuning to an intended transmission frequency which reduces errors in receiving data. In a preferred implementation the invention may be an automated process which reduces a frequency offset from the intended frequency and to prevent frequency drifting in the receiver. Use of the present invention may allow a network operator to more reliably deliver data rates and improve signal quality to its customers.

DETAILED DESCRIPTION OF THE INVENTION

The present invention improves performance of a network element, such as a modem, set top box (STB), or media terminal adapter (MTA) unit, by ensuring that the receiver in the network element receives communications on the transmitted frequency of a network operator. The present invention determines the frequency offset between the frequency on which the receiver has locked and the intended frequency being transmitted by the operator. The difference in the frequency offset is reduced to be below a predetermined value. The frequency offset is continuously monitored to correct for offset due to drift in circuit components such as a crystal oscillator in the receiver.

Figure 1:
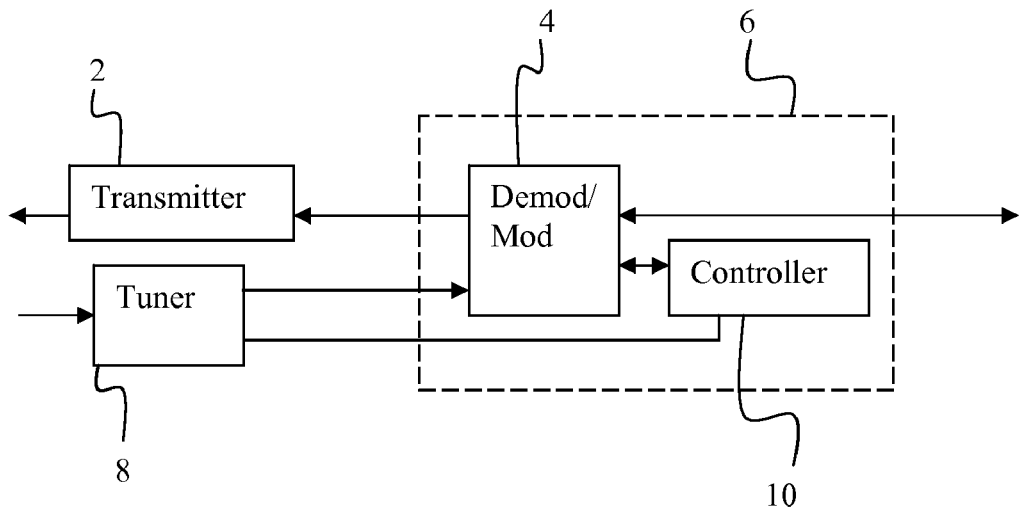
FIG. 1 illustrates a general architecture of a conventional network element.

Several basic components of a conventional receiver are illustrated in FIG. 1. As illustrated in FIG. 1, a tuner 8 receives a downstream signal from a network, such as from a headend of a CATV network. In the installation of the network element on the network, or turning on the power of the network element, the tuner 8 is instructed by controller 10 to scan the frequency spectrum associated with the downstream signals of the network, e.g. 88 KHz to about 850 KHz. Controller 10 may have a channel map stored which instructs which channels to scan as likely candidates for the transmission frequency from the network. Once data is received, the data is demodulated by demodulator/modulator 4 and provided to a user. The tuner 8 is generally locked to the frequency (or channel) at which data is first received, which may not be the actual transmission frequency of the network operator. Upstream communications may also be provided from a user via demodulator/modulator 4 and transmitter 2. Those of skill in the art will appreciate that demodulator/modulator 4 demodulates the downstream data for use by a user, and modulates the upstream data for transmission through the network.

Figure 2:
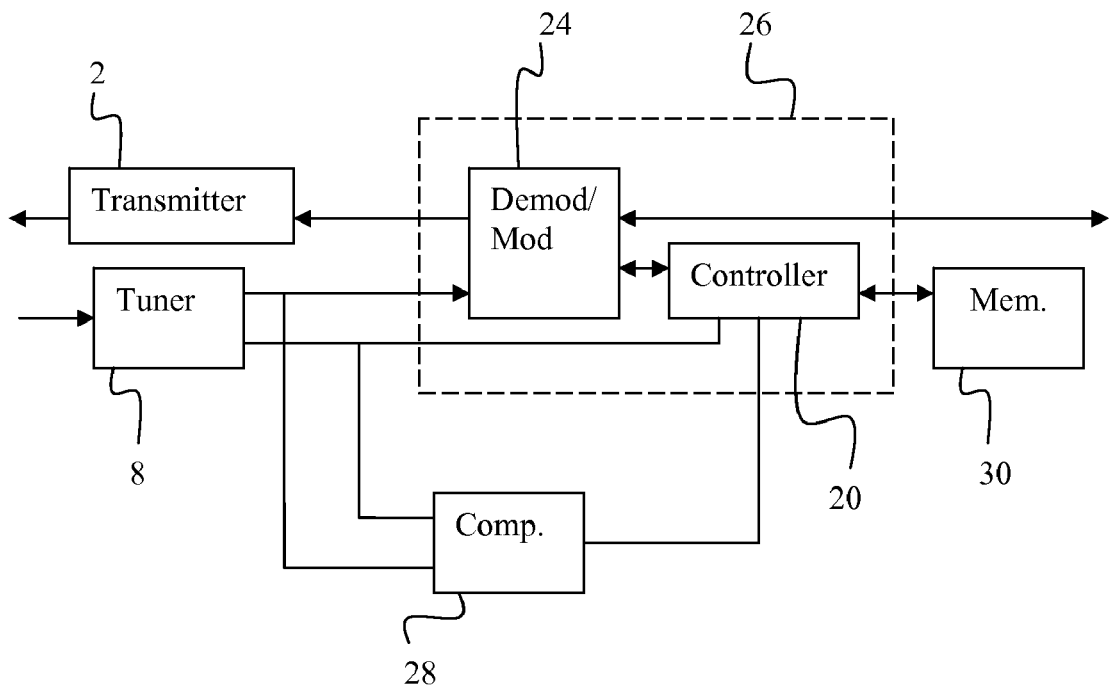
FIG. 2 illustrates an exemplary architecture of a network element in accordance with the present invention.

FIG. 2 illustrates exemplary architecture of a receiver in accordance with the principles of the present invention. As illustrated in FIG. 2, a tuner 8 receives a downstream signal from a network, such as from a headend of a CATV network. In the installation of the network element on the network, or a power on of the network element, the tuner 8 is instructed by controller 20 to scan the frequency spectrum associated with the downstream signals of the network, e.g. 88 MHz to about 850 MHz. Controller 20 may have a channel map stored which instructs which channels to scan as likely candidates for the transmission frequency from the network. Once data is received, the data is demodulated by demodulator/modulator 24 and provided to a user. The tuner 8 is locked to the frequency (or channel) at which data is first received, which may not be the actual transmission frequency of the network operator. Upstream communications may also be provided from a user via demodulator/modulator 24 and transmitter 2. Those of skill in the art will appreciate that demodulator/modulator 24 demodulates the downstream data for use by a user, and modulates the upstream data for transmission through the network.

Comparator 28 in FIG. 2 compares the frequency which tuner 8 has locked with the actual transmission frequency used by the network. The actual transmission frequency may be preprogrammed into controller 20 and stored in memory 30. A message indicating the actual transmission frequency may also be provided by the headend, such as during a modem registration process or a message associated with a station maintenance (SM) message. Memory 30 may be a RAM or ROM or may include both a RAM and a ROM. Memory 30 may also store a channel map used by controller 20 in an initial frequency scanning operation, as well as instructions for controller 20 to perform an initial frequency scanning operation and a frequency offset adjustment operation.

Figure 3:
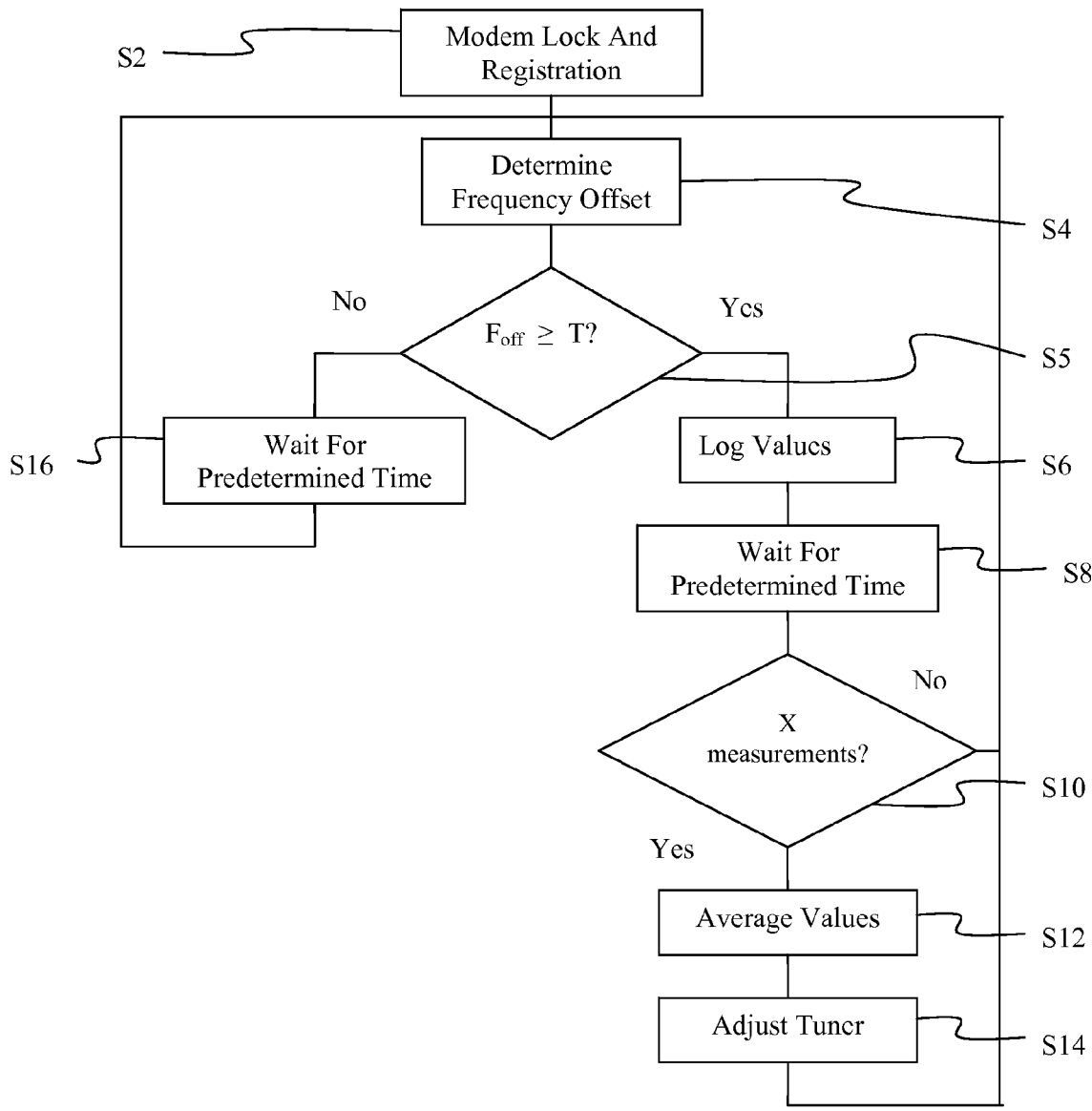
FIG. 3 illustrates an exemplary process flow for correcting a frequency offset in accordance with the present invention.

An exemplary process for tuning the transmitted frequency is illustrated in FIG. 3. As illustrated in FIG. 3, the process begins with the network element locking onto a frequency at which data is received and registering with the headend, step S2. The frequency offset is determined in step S4 by comparing the locked frequency against the actually transmit frequency. In step S5, it is determined whether the frequency offset $F_{off}$ is greater than or equal to a threshold offset T. If the determination is No, the process includes a step of waiting for a predetermined period of time in step S16 and returns to step S4 to continually measure and monitor the frequency offset. In this manner, the process may correct for frequency drifts which may be associated with an oscillator drift or other factors.

If the frequency offset is greater than the threshold T, then the values are logged in step S6 and the process includes a step of waiting for a predetermined period of time in step S8, which may be the same length of time as in step S16 or another period of time. If a predetermined number of measurements X has not been made in the process, step S10, NO, then the process returns to step S4 to determine the frequency offset again. In this manner, the process may reduce effects from erroneous or tainted measurements. If a predetermined number of measurements X has been made, step S10, YES, the average value of the measurements are determined, step S12 and the frequency of the tuner is adjusted, step S14.

The frequency of the tuner may be adjusted by stepping the tuner by a predetermined frequency amount which is generally associated with the capability of the tuner, such as 5 KHz. The step size may also be determined based on the size of the frequency offset, or an average value of the frequency offset, such as a step size of 5 KHz for a frequency offset of 100 KHz or less and a larger step size for a larger frequency offset, such as a step size of 50 KHz for a frequency offset greater than 100 KHz.

Figure 4:
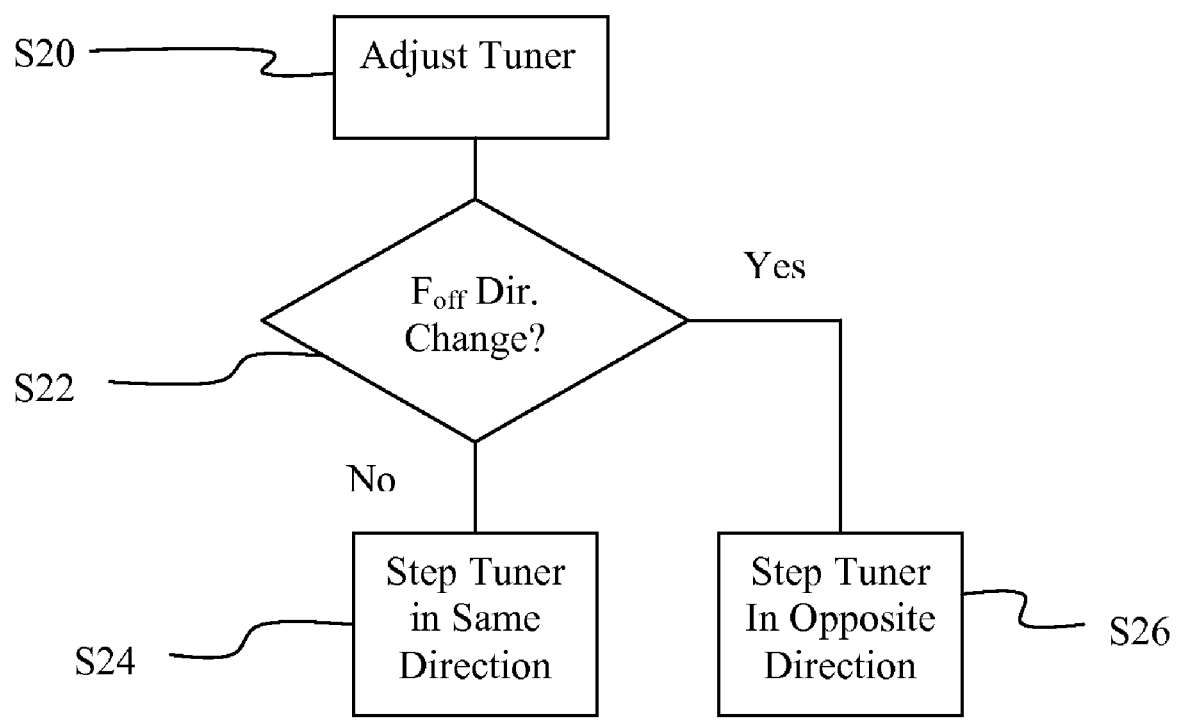
FIG. 4 illustrates an exemplary process flow for adjusting a tuner in accordance with the present invention.

FIG. 4 illustrates an exemplary process for determining the direction of the tuner adjustment which may be user in step S14 of FIG. 3, e.g. to either increase or decrease the tuner frequency. As illustrated in FIG. 4, step S20, an instruction to adjust the tuner may be followed by a determination of a direction change in the frequency offset value, step S22, e.g. whether the frequency offset is a negative value or a positive value when compared to the intended frequency. If the determination is No, step S22, NO, indicating that the frequency offset direction has not changed, the tuner continues to step in the same direction to reduce the offset. If the determination is Yes, step S22, YES, indicating that the frequency offset direction has changed, the tuner steps in the opposite direction to reduce the offset.

The processes in FIGS. 3-4 may be implemented in hard wired devices, firmware or software running in a processor. Any of the processes illustrated in FIGS. 3-4 may be contained on a computer readable medium, such as memory 30, which may be read by controller 20. A computer readable medium may be any medium capable of carrying instructions to be performed by a microprocessor, including a CD disc, DVD disc, magnetic or optical disc, tape, silicon based removable or non-removable memory, packetized or non-packetized wireline or wireless transmission signals.

The present invention enables more accurate tuning to an intended transmission frequency which reduces errors in receiving data. The present invention may also allow a network element which is programmed with a channel plan which is different from the channel plan of the network on which it is installed to accurately lock onto the transmission channels of network, i.e. to tune to frequencies away from the pre-stored channel plan to lock onto the correct transmission frequencies of the network.

In a preferred implementation the invention may be an automated process which reduces a frequency offset from the intended frequency and to prevent frequency drifting in the receiver. Use of the present invention may allow a network operator to more reliably deliver data rates and improve signal quality to its customers.

What is claimed is:

1. A receiver comprising:
   a tuner configured to tune to communication channel frequencies as a locked frequency which provides a data signal;
   a controller configured to instruct the tuner to tune to specific communication channel frequencies; and
   a comparator configured to compare a locked frequency against a transmission frequency and to provide the result of the comparison to the controller as a frequency offset, wherein the controller instructs the tuner to tune another frequency when the frequency offset is greater than or equal to a predetermined threshold value, further including a memory carrying a channel plan,
   wherein the tuner is instructed to tune to a frequency according to the channel plan as a channel plan frequency, and the controller instructs the tuner to tune to another frequency which is away from the channel plan frequency when the frequency offset is greater than or equal to a predetermined threshold value.

2. The receiver of claim 1, further comprising a demodulator configured to receive the locked frequency and to demodulate the data signal contained in the locked frequency.

3. The receiver of claim 1, wherein the controller instructs the tuner to tune to frequencies in a direction based on a plurality of frequency offset measurements.

4. The receiver of claim 1, wherein the controller instructs the tuner to tune another frequency when an average value of a plurality of frequency offsets is greater than or equal to a predetermined threshold value.

5. A method of tuning a receiver to a transmission frequency comprising the steps of:
   locking a tuner to a communication channel frequency which provides a data signal as a locked frequency;
   determining an amount of separation between the locked frequency and a transmission frequency to be received by the receiver as a frequency offset;
   determining if the frequency offset is greater than or equal to a threshold value; and
   tuning the tuner to another frequency if the frequency offset is greater than or equal to the threshold value,
   wherein the tuner is instructed to tune to the locked frequency according to a channel plan stored on the receiver as a channel plan frequency, and tuning to another frequency which is away from the channel plan frequency when the frequency offset is greater than or equal to a predetermined threshold value.

6. The method of claim 5, wherein the step of tuning the tuner to another frequency includes determining a direction for tuning based on a plurality of frequency offset measurements.

7. The method of claim 5, wherein the step of tuning the tuner to another frequency includes determining if an average value of a plurality of frequency offsets is greater than or equal to a predetermined threshold value.

8. A non-transitory computer readable medium carrying instructions for a computer to perform a method of tuning a receiver to a transmission frequency comprising the steps of:
   locking a tuner to a communication channel frequency which provides a data signal as a locked frequency;
   determining an amount of separation between the locked frequency and a transmission frequency to be received by the receiver as a frequency offset;
   determining if the frequency offset is greater than or equal to a threshold value; and
   tuning the tuner to another frequency if the frequency offset is greater than or equal to the threshold value,
   wherein the tuner is instructed to tune to the locked frequency according to a channel plan stored on the receiver as a channel plan frequency, and tuning to another frequency which is away from the channel plan frequency when the frequency offset is greater than or equal to a predetermined threshold value.

9. The computer readable medium of claim 8, wherein the step of tuning the tuner to another frequency includes determining a direction for tuning based on a plurality of frequency offset measurements.

10. The computer readable medium of claim 8, wherein the step of tuning the tuner to another frequency includes determining if an average value of a plurality of frequency offsets is greater than or equal to a predetermined threshold value.

* * * * *